United States Patent [19]

Shan et al.

[11] Patent Number: 5,514,247

[45] Date of Patent: May 7, 1996

[54] PROCESS FOR PLASMA ETCHING OF VIAS

[75] Inventors: Hongching Shan, San Jose; Robert Wu, Pleasanton, both of Calif.

[73] Assignee: Applied Materials, Inc., Santa Clara, Calif.

[21] Appl. No.: 272,356

[22] Filed: Jul. 8, 1994

[51] Int. Cl.⁶ .......................... H01L 21/00; C03C 15/00; C23F 1/00; B44C 1/22
[52] U.S. Cl. .................... 156/643.1; 156/644.1; 156/656.1; 156/657.1; 216/18; 216/67; 216/75; 216/79; 437/235; 437/245
[58] Field of Search ............... 156/643.1, 644.1, 156/653.1, 656.1, 657.1, 659.11; 437/228, 235, 238, 241, 245, 187; 216/17, 18, 19, 41, 67, 75, 79, 56; 252/79.1

[56] References Cited

U.S. PATENT DOCUMENTS

| | | | |
|---|---|---|---|
| 4,661,204 | 4/1987 | Mathur et al. | 156/644.1 X |
| 5,176,790 | 1/1993 | Arleo et al. | 156/644.1 X |
| 5,256,245 | 10/1993 | Keller et al. | 156/643.1 X |
| 5,354,417 | 10/1994 | Cheung et al. | 156/643.1 |

*Primary Examiner*—William Powell
*Attorney, Agent, or Firm*—Naomi Obinata; Robert W. Mulcahy; Peter Sgarbossa

[57] ABSTRACT

Disclosed is a process for plasma etching a mask patterned dielectric film to form vias on a semiconductor wafer, so that the resulting etched structure is devoid of residues on the walls of the structure. A via is an opening through a dielectric material through which a point of contact of underlying metal with a metal film deposited over the dielectric is made. The underlying metal, when exposed to plasma, has a tendency to sputter onto the vertical wall portions of the contact via structures. The metal-containing sputtered material forms a residue that essentially cannot be removed in the subsequent photoresist stripping process typically used in semiconductor manufacturing. The plasma etch process in accordance with the invention enables removal of the sputtered metal by utilizing with the basic dielectric etch gases a gas that reacts with the metal to form volatile compounds which are readily evacuable.

26 Claims, 1 Drawing Sheet

PROCESS FOR PLASMA ETCHING OF VIAS

BACKGROUND OF THE INVENTION

1. Field of Invention

The present invention relates to the field of semiconductor processing. More specifically, the invention is a method of plasma etching through dielectric material to form holes for interconnecting a lower layer of metal with an upper layer of metal through structures opened within the dielectric material known as vias.

2. Background

In semiconductor integrated circuit device fabrication, an aluminum layer is often deposited and then may be etched to create a set of wires or interconnects 12 (FIG. 1), over which is deposited a layer of dielectric or insulating material 10, often a silicon dioxide. The dielectric layer 10 is masked and etched to open narrow profile openings known as vias (shown in phantom at 11 in FIG. 1). Each via respectively extends as an opening through dielectric layer 10 to a portion of the lower aluminum layer or to a wire 12. Another layer of metal 14 is deposited over the dielectric film. As shown in FIG. 2, the deposited metal fills the vias, forming metallic contact structures 13 engaging the exposed underlying metal at the bottom of the vias and making points of contact through layer 11 between the lower wires 12 and the upper metal layer 14 (which may also in turn be etched to create a layer of wires). The geometries of the vias 11 and the contact structures 13 which now fill them are usually circular although they may also form a trench shape. Note that vias 11 have been positioned so that the metallic structures which fill them provide contacts between two separated wire or metal layers; such vias which perform this function are also termed "contact vias" or simply "vias".

To open the via structures, the dielectric film is etched in a plasma processing reactor. Fluorine-based gases, such as $CHF_3$, $CF_4$, $C_2F_6$, sometimes in combination with $O_2$, Ar or He are typically the most effective plasmas for obtaining desired etch rates, selectivities and uniformities. A typical process for etching a dielectric layer to form a via is described in Arleo et al, U.S. Pat. No. 5,176,790, incorporated herein by reference, which discusses etching the dielectric layer in a plasma of a mixture of fluorine-containing gases and nitrogen-containing gases.

A problem encountered in etching a via is the deposition of a residue 16 onto the sidewall of a via. An example of such a residue is shown in FIG. 3. It is thought that the residue is a mixture of organic material and metal, with the organic material contributed by the processing gases and sputtered photoresist, and the metal portion from sputtered contributions from the metal layer at the bottom of the via. The residue forms during the etching process as the via is opened through layer 10, thus exposing the underlying metal to the plasma. For this reason the residue is referred to as backsputtered metal. The backsputtered metal residue has been a perennial problem in manufacturing integrated circuit devices because it alters the resistivity of the subsequent metal-to-metal connection through the vias, which can lead to device failure.

In the more modern device structures the metal backsputtering problem is exacerbated. One reason is the common use of topographic metal layers at different depths underlying the dielectric film together with the planarization of the dielectric film on top of the metal. Such planarization of the dielectric film is necessary for more precise masking of the dielectric film with via shapes and, in turn, more precise etching of the dielectric to form the vias, but it results in thinner dielectric film areas where the underlying metal is closer to the surface of the planarized dielectric layer, and thicker dielectric film areas where the underlying metal lies more deeply underneath the dielectric. Then during via etching of the planarized dielectric layer positioned over topographical metal, the shallower areas of the planarized dielectric are opened to the underlying metal before the thicker areas. The metal at the bottom of the shallower vias is thereby exposed to plasma during the overetch period, that is, the additional time over which the process continues to complete the etching of the deeper vias. Because of the varying depths of the vias, the overetch period may have to be relatively prolonged. It is during the time in which metal at the bottom of the via is exposed to plasma that the metal sputters onto the sidewalls to form unwanted residue.

The residue is difficult, if not impossible to remove in a subsequent plasma photoresist stripping process. The residue is not a pure metal, but rather a mixture of metal and organic etch residues. The photoresist stripping process may remove some of the organic components of the residues, but the backsputtered metal portions and compositions thereof remain. The remaining residue must be removed, however, or else either the resistivity will be altered for the subsequent interconnection metallization (i.e., the metallic contact structures 13) or particularly in higher density devices, the via may become so clogged with residue that the formation of the interconnection metallization is impeded. An additional wet chemical treatment is conventionally used to remove the remaining residue. A problem with wet chemical treatment, however, is that it is an additional processing step. Wet chemical treatment adds undesirable cost to manufacturing production. A better way to deal with the backsputtered metal residue problem is to remove it before photoresist stripping or prevent it from occurring. Prevention was the attempt of the process disclosed in U.S. Pat. No. 5,176,790 by using process gases that heavily deposited polymer material within the vias during etching. However, for more highly topographic metal as is typically found in modern semiconductor integrated circuit devices, a lengthy overetch is required during the dielectric etch. If the process of U.S. Pat. No. 5,176,790 is used for a long overetch an excessive amount of polymerization occurs, which in turn is difficult to remove completely. Hence, the process disclosed in U.S. Pat. No. 5,176,790 is not sufficient for modern semiconductor integrated circuit structures.

Although presented in a different context, the concept of adding a small amount of gas to remove unwanted polymer residue remaining following a silicon dioxide over silicon contact etch was explored in Abstract No. 303 by Okumura et al, in the Electrochemical Society Conference of 1980. Okumura et al added chlorine to the silicon dioxide contact etch process, and found that the chlorine helped to dissociate C-F bonds in the silicon dioxide etch process chemistry and removed polymer residue at the surface of silicon exposed upon etching through the silicon dioxide layer. But in the context of via etching, that is, etching a dielectric and stopping the process upon reaching an underlying metal film, it is not sufficient to add a gas that works simply by enhancing dissociation of C-F bonds for removing metal residue.

SUMMARY OF INVENTION

In accordance with the invention, a process is provided for etching via structures so that backsputtered metal residue on the walls of the vias caused by underlying metal sputtering is removed during the dielectric etch. The process involves plasma etching a masked dielectric layer within a plasma etch reactor using fluorine bearing gases. Either at the beginning of the dielectric etch process or at a point in time during the dielectric etch when the metal underlying the dielectric is exposed to plasma, a gas capable of forming volatile compounds with the underlying metal is added to the fluorine bearing gases. Examples of such gas capable of forming volatile compounds with the underlying metal include, but are not limited to, chlorine or bromine bearing gases such as $Cl_2$, HCl, $BCl_3$, HBr, and $Br_2$. The process is particularly useful for modern integrated circuit device structures with highly topographic metal underlying a planarized dielectric layer, where the underlying metal in the shallower or thinner areas of the planarized dielectric is exposed to plasma for a substantial period of time while the remaining areas of the planarized dielectric are still etching.

DETAILED DESCRIPTION OF PREFERRED EMBODIMENTS

Figure 1:
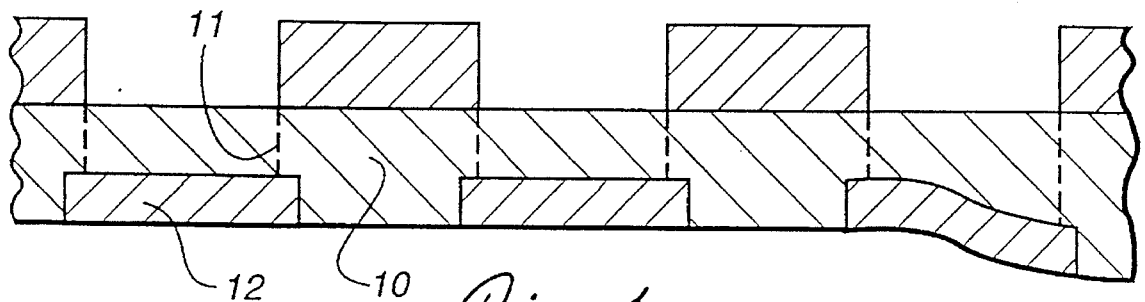
FIG. 1 is a side view of a typical starting structure for a via.
Figure 2:
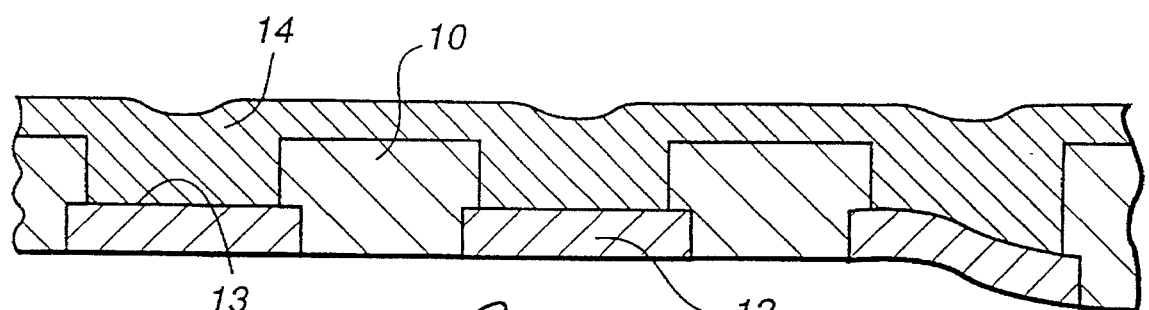
FIG. 2 is a side view of a typical metal deposition following a via etch.
Figure 3:
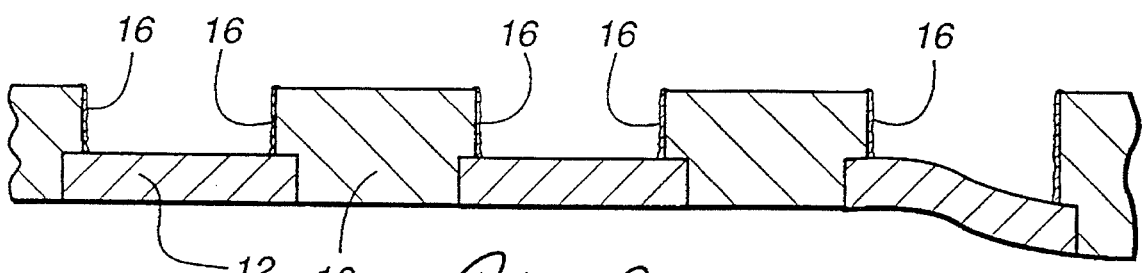
FIG. 3 is view showing undesirable residue of backsputtered metal.

For purposes of this description, "dielectric" means a silicon oxide, silicon nitride, or any other film that has dielectric properties and is typically used as an insulating layer in semiconductor devices. "Metal" means aluminum, alloyed aluminum, or any other metal film, including any antireflective coating placed thereon, useful to form conductive interconnecting structures in semiconductor devices.

Although the invention is applicable generally to the formation of vias in any dielectric layer over metal layer context, the invention will be described with particular reference to the preferred application of the manufacture of semiconductor devices, beginning with a semiconductor wafer substrate. In a typical such application, a film of aluminum alloy with a TiN antireflective coating on the top of the aluminum is deposited upon the substrate and patterned. A dielectric film of silicon dioxide is deposited over the patterned metal layer. The dielectric film is patterned by means of photoresist lithography techniques to establish patterns which upon etching will establish vias through the dielectric which will allow metallic contact structures between the underlying patterned metal layer, and an overlying metal layer to be deposited thereafter.

Via etching in accordance with the invention is carried out within the context of either a one-step process or in a two-step process. The two-step process includes a main etch step, and overetch step which begins upon first exposure of the underlying metal at the bottom of a via to the plasma. The main etch step is designed to etch the dielectric (as well as any antireflective coating, which must also be removed), given a previously specified selectivity to photoresist, and a previously specified etch rate uniformity. The overetch step is designed to complete the via-defining process, while adding a metal-scavenging gas to help deal with the effects of the exposure of the underlying metal to the plasma and the resulting sputtering and redeposition of metal on the via walls. The one-step process simply incorporates the metal scavenging gas from the beginning of the overall process. The improvements of the invention can either be incorporated into the one-step process, or can be a separate process recipe incorporated into the overetch step of the two-step process.

In the case of aluminum as the underlying metal, and thus of aluminum backsputtering onto the sidewalls, the scavenging gas for either the one-step or two-step process is a halogen-bearing gas, for example, $Cl_2$ or HCl. It is theorized that the chlorine of these gases becomes dissociated within the plasma and reacts with the aluminum, forming a volatile $AlCl_x$ compound which has a vapor pressure higher than the pressure typically maintained for reactive ion etching in the processing chamber. The volatile $AlCl_x$ compound is easily removed via the chamber vacuum pump.

In particular, a wafer containing a dielectric film, for example of silicon oxide, overlying a metal film and patterned for contact vias, as described previously, is placed onto a support platform within a plasma etch processing chamber, preferably of a magnetically enhanced, reactive ion etch system as for example, the Precision 5000 Etch System commercially available from Applied Materials, Inc. For the main etch, a gas mixture of $CHF_3$, $CF_4$, Ar, and $N_2$ are flowed into the processing chamber in flow ranges of about 15 to 100 sccm (standard cubic centimeters per minute) $CHF_3$, 0 to 50 sccm $CF_4$, 10 to 150 sccm Ar, and 5 to 100 sccm $N_2$ for a 13 liter chamber. The Ar and $N_2$ are thought to be effective as essentially non-reactive diluents. The pressure within the chamber is stabilized at about 50 to 300 millitorr.

Although there are several ways to create a plasma, in a preferred embodiment a plasma is created by applying radio frequency power (e.g., 13.6 MHz) ranging from 300 to 800 watts, to the support platform within the processing chamber on which the wafer sits. To increase ionization of the plasma, a magnetic field strength of 20 to 100 Gauss can be used. The support platform temperature is kept cool to prevent the wafer from heating excessively; a typical range is 5 to 45 degrees C. For further ensuring thermal contact between the wafer and the support platform, helium gas is admitted to the space between the backside of the wafer and the support platform.

Etching of the dielectric begins upon creation of the plasma within the chamber. The non-inert gases admitted into the chamber become reactive in plasma form. The reactive gases combine with molecules from the dielectric film and form volatile compounds. A certain degree of ion sputtering of the surface of the dielectric also takes place. The volatile compounds are pumped out of the chamber through a pumping port. In the two-step process, the main etch process is continued until the shallowest areas of the dielectric and antireflective coating, if any, are etched through and the first evidence of the underlying metal is exposed to the plasma. Thereupon, the process is switched to the overetch step. The overetch step uses the same gas chemistries as the main etch, except that metal-scavenging, halogen-bearing gas is added. By "metal-scavenging" is meant a gas that reacts with the underlying metal to form readily volatilized compounds. Examples of such metal-scavenging gases that form volatile compounds with aluminum, a typically used underlying metal, include but are not limited to, $Cl_2$, HCl, $Br_2$, HBr, and $BCl_3$. Flow ranges of about 5 to 25sccm of the metal-scavenging gas are added to the basic dielectric etch gas mixture. Some of the ratios of gases, or for that matter, pressure, power level or magnetic field strength, may have to be adjusted from the main etch step to maintain etch rate, selectivity and uniformity during the overetch step. The overall ratio of metal-scavenging gas with respect to the fluorinated gases is generally about one part in five to ten or thereabout, as the portion of the scavenging gas must be small so that etch rate selectivity of the dielectric to the metal can be maintained. In other words, the amount of the metal-scavenging gas is kept small enough that deposits on the contact sidewalls can be removed while keeping the etch rate of the metal at the bottom of the via at a minimum. As mentioned above, a single-step process simply incorporates the metal-scavenging, halogen-bearing gas into the dielectric etch gas chemistry for the entire time of the process.

Following the dielectric etch, the wafer is placed within a photoresist stripper to remove the photoresist and other organic polymer.

Figure 4:
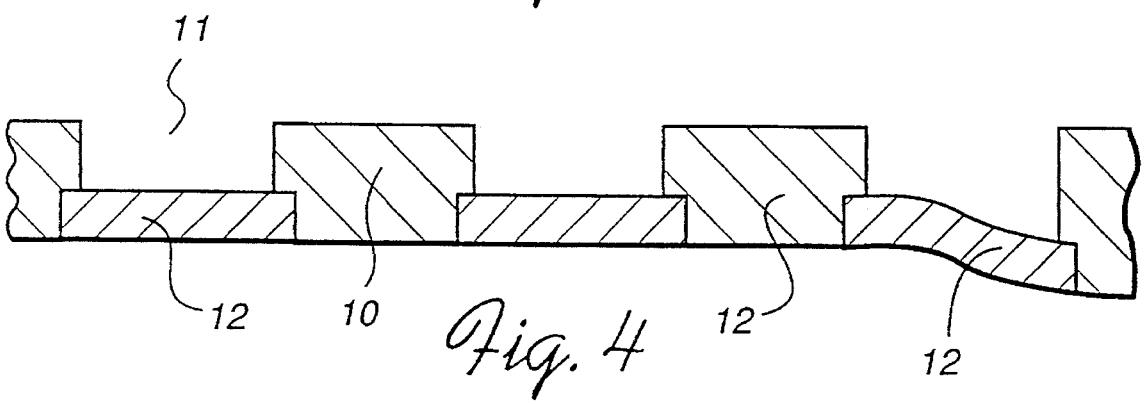
FIG. 4 is a view of a via showing the desirable profile following a dielectric etch in accordance with the invention.

The optimal flow ranges, pressure, rf power and magnetic field strength depend on a number of factors including the size of the chamber, the type of dielectric being etched, the type of underlying metal, wafer size and desired process results such as etch rate, uniformity and selectivity. In a statistically-designed experiment on 150 mm diameter wafers for etching in a magnetically-enhanced, reactive ion etch system, where the dielectric film layer was a silicon dioxide of about 1 micron thickness over a TiN-coated aluminum, the following process recipe utilizing an Applied Materials Precision 5000 Etch System was found to successfully etch vias within the dielectric and remove backsputtered metal residue:

main etch: 25 sccm $CHF_3$, 25 sccm $CF_4$, 75 sccm Ar, 10 sccm $N_2$, 250 millitorr pressure, 60 Gauss, 650 Watts, until such time that the shallowest areas of the dielectric are etched through to the underlying metal.

overetch: 45 sccm $CHF_3$, 0 sccm $CF_4$, 25sccm Ar, 10 sccm $N_2$, 10 sccm $Cl_2$, 250 millitorr pressure, 80 Gauss, 650 Watts. The end-resulting via etched structure is a clean geometry free of residues, as shown in FIG. 4.

Additional advantages and modifications will be obvious to those skilled in the art. The descriptions heretofore should not be construed as limited to any of the specific details provided. Modifications may be made without departing from the spirit or scope of the general inventive concept as defined by the following claims and their equivalents.

What is claimed is:

1. A method for etching vias within a patterned dielectric film positioned over an underlying film of metal, comprising the steps of:

placing a substrate containing a patterned dielectric film positioned over an underlying metal film to be etched onto a support platform within a plasma etch reactor:

maintaining a vacuum within the reactor chamber;

admitting gases into the reactor chamber for plasma etching the dielectric film;

admitting one or more gases into the reactor chamber capable of reacting with the underlying metal film to form readily volatilized compounds within the subatmospheric pressure environment of the plasma etch reactor chamber: and forming a plasma of said gases to etch the patterned dielectric film selectively with respect to the underlying metal, while removing sputtered deposits from the underlying metal on the vertical wall portions of the etched via structures, whereby the vias are suitable for accepting metal to form contacts between the underlying metal film and any subsequently deposited overlying metal film.

2. A method as in claim 1, in which the gases for etching the dielectric film comprise fluorine bearing and non-reactive gases.

3. A method as in claim 2, in which the fluorine bearing gases comprise $CHF_3$, $CF_4$, $C_2F_6$, or combinations thereof.

4. A method as in claim 2, in which the non-reactive gases comprise argon, nitrogen, or combinations thereof.

5. A method as in claim 1, in which the gases capable of reacting with the underlying metal film are chlorine or bromine bearing gases or compounds or combinations thereof.

6. A method as in claim 5, in which the gases that form volatile compounds with the metal film comprise $Cl_2$, HCl, $BCl_3$, $Br_2$, HBr, or combinations thereof.

7. A method as in claim 1, in which the subatmospheric pressure is a pressure of approximately 300 millitorr or lower.

8. A method as in claim 1, in which the dielectric film is planar, and the underlying metal is located at varying depths below the surface of the dielectric film.

9. A method as in claim 1, in which the plasma is formed by applying radio frequency power to the support platform in the range of approximately 300 to 800 Watts.

10. A method as in claim 1, in which the step of admitting gases that form readily volatilized compounds from reaction with the underlying metal is carried out after metal underlying at least one via is exposed to the plasma.

11. A method for etching vias in a dielectric layer of a substrate which also includes metal underlying the dielectric layer, comprising the steps of:

masking the dielectric layer to define a pattern of positions for the desired locations of the vias;

positioning the substrate within a plasma etch reactor;

evacuating the reactor to maintain same at a subatmospheric pressure;

admitting gas into the reactor capable of etching the dielectric layer upon being energized into a plasma;

admitting gas into the reactor capable of reacting with the underlying metal upon exposure thereto to form readily volatilized compounds within the subatmospheric pressure environment of the plasma etch reactor; and forming a plasma of gases within the reactor to etch the dielectric film to form vias therethrough in accordance with the masking pattern and to remove any metal from the via walls which may be deposited thereon due to exposure of the underlying metal to the plasma.

12. A method as in claim 11, in which the gas capable of etching the dielectric layer are one or more fluorine bearing gases, and the gas capable of forming volatile compounds with the underlying metal are chlorine or bromine bearing gases or compounds or combinations thereof.

13. A method as in claim 12, in which the gas capable of etching the dielectric layer includes $CHF_3$, $CF_4$, $C_2F_6$, or combinations thereof.

14. A method as in claim 11, in which the gas capable of forming volatile compounds with the underlying metal are chlorine or bromine bearing gases or compounds or combinations thereof.

15. A method as in claim 14, in which the gas capable of forming volatile compounds includes $Cl_2$, HCl, $BCl_3$, $Br_2$, HBr, or combinations thereof.

16. A method as in claim 14, in which the underlying metal is aluminum and the gas capable of forming volatile compounds therewith are chlorine or bromine bearing gases.

17. A method as in claim 11, in which the gas capable of forming volatile compounds with the underlying metal is admitted only when the plasma first contacts the underlying metal.

18. A method as in claim 11, in which both the gas etching the dielectric and the gas forming volatile compounds with the metal are admitted simultaneously.

19. A method as in claim 11, in which the dielectric layer is planar, and the underlying metal is located at varying depths below the surface of the dielectric layer.

20. A method of etching vias in a dielectric layer of a substrate which also includes metal underlying the dielectric layer and in which the dielectric layer has been provided with a mask pattern defining the desired positions of the vias, the method comprising the steps of:

etching the dielectric layer using a plasma process including fluorine bearing gases to selectively define vias at positions within the dielectric layer which are left exposed to the plasma process by the mask pattern;

etching the walls of the vias using chlorine or bromine bearing gases or compounds or combinations thereof capable of reacting with metal deposited on the walls due to exposure of the underlying metal to the via etching plasma process to remove such metal deposits by forming readily-volatilized compounds therewith.

21. A method as in claim 20, in which the underlying metal is located at varying depths, and in which etching of some vias and the removal of metal from the walls of other vias continue simultaneously.

22. A method as in claim 21, in which both the fluorine bearing gas and the chlorine or bromine bearing gas are present throughout the etching of the dielectric layer.

23. A method as in claim 21, in which the chlorine or bromine bearing gas is utilized after the via etching process has proceeded long enough to expose the underlying metal.

24. A method as in claim 20, in which the fluorine bearing gases include $CHF_3$, $CF_4$, $C_2F_6$, or combinations thereof.

25. A method as in claim 20, in which the chlorine or bromine bearing gases include $Cl_2$, $HCl$, $BCl_3$, $Br_2$, $HBr$, of combinations thereof.

26. A method as in claim 20, which further includes the steps of removing the mask material and depositing an overlying metal layer on the dielectric layer, with such overlying layer extending into the vias and establishing through each via a contact with the underlying layer.

* * * * *